(12) United States Patent
Batra et al.

(10) Patent No.: US 6,577,010 B2
(45) Date of Patent: Jun. 10, 2003

(54) STEPPED PHOTORESIST PROFILE AND OPENING FORMED USING THE PROFILE

(75) Inventors: Shubneesh Batra, Boise, ID (US); Christophe Pierrat, Hsin-Chu (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/996,253

(22) Filed: Nov. 28, 2001

(65) Prior Publication Data

US 2002/0111030 A1 Aug. 15, 2002

Related U.S. Application Data

(63) Continuation of application No. 09/662,407, filed on Sep. 14, 2000, which is a continuation of application No. 09/213,742, filed on Dec. 17, 1998, now Pat. No. 6,200,906.

(51) Int. Cl.$^7$ ................................. H01L 23/48
(52) U.S. Cl. .................. 257/751; 257/758; 257/773; 257/774; 257/775
(58) Field of Search .................... 438/632, 640, 438/648; 257/751, 758, 775, 773, 774

(56) References Cited

U.S. PATENT DOCUMENTS

| | | | |
|---|---|---|---|
| 5,635,337 A | 6/1997 | Bartha et al. | 430/323 |
| 5,741,624 A | 4/1998 | Jeng et al. | 430/312 |
| 5,753,417 A | 5/1998 | Ulrich | 430/312 |
| 5,759,911 A | 6/1998 | Cronin et al. | 438/622 |
| 5,821,169 A | 10/1998 | Nguyen et al. | 438/736 |
| 5,877,076 A * | 3/1999 | Dai | 438/597 |
| 5,980,657 A | 11/1999 | Farrar et al. | 148/438 |
| 6,060,379 A * | 5/2000 | Huang et al. | 438/618 |
| 6,069,068 A | 5/2000 | Rathore et al. | 438/628 |
| 6,074,942 A * | 6/2000 | Lou | 438/624 |
| 6,200,906 B1 | 3/2001 | Batra et al. | 438/708 |

* cited by examiner

*Primary Examiner*—Benjamin L. Utech
*Assistant Examiner*—Binh X. Tran
(74) *Attorney, Agent, or Firm*—Fletcher, Yoder & Van Someren

(57) ABSTRACT

Stepped photoresist profiles provide various methods of forming profiles in an underlying substrate. The stepped photoresist profiles are formed in two layers of photoresist that are disposed over the substrate. The substrate is then etched twice using a respective opening in each photoresist layer to create a stepped profile in the substrate.

10 Claims, 3 Drawing Sheets

STEPPED PHOTORESIST PROFILE AND OPENING FORMED USING THE PROFILE

This application is a Continuation of application Ser. No. 09/662,407, filed Sep. 14, 2000, which is a continuation of application Ser. No. 09/213,742, filed Dec. 17, 1998, which issued as U.S. Pat. No. 6,200,906B1 on Mar. 13, 2001.

BACKGROUND OF THE INVENTION

1. Field of the Invention

This invention relates generally to integrated circuits and, more particularly, to a photoresist technique for use in fabricating integrated circuits.

2. Description of the Related Art

Integrated circuits, such as microprocessors and memory devices, are used in a wide variety of applications. Such applications include personal computers, industrial control systems, telephone networks, and a host of consumer products, just to name a few. As most people are aware, an integrated circuit is a highly miniaturized electronic circuit that has revolutionized the functionality, dependability, and size of these various products.

In the manufacturing of integrated circuits, numerous microelectronic circuits are simultaneously fabricated on a semiconductor substrate. Such substrates are typically referred to as wafers, and a typical wafer includes a number of different regions, known as die regions. When the fabrication of the integrated circuits on the wafer is complete, the wafer is cut along these die regions to form individual die. Each die contains at least one microelectronic circuit, which is usually replicated on each die.

Although often referred to as semiconductor devices, integrated circuits are in fact fabricated from numerous materials of varying electrical properties. For example, integrated circuits are typically built upon a base substrate which is commonly made of semiconductive or insulative material. The characteristics of the base substrate may be altered, by etching or doping for instance, and various materials, such as insulators, dielectrics, conductors, and semiconductors, may be deposited on the base substrate in various patterns to form the final integrated circuit.

Of particular interest in this disclosure is the formation of openings in a portion of the substrate of the integrated circuit. Such openings are typically formed by fabricating a structure in a layer of insulative or dielectric material. Such structures may include, for instance, trenches, contact openings, vias, or containers. These various structures are used in most integrated circuits to form contacts between various circuit elements or to create various circuit elements.

Such structures are typically formed using a photolithographic process. Photolithography is a transfer process where the pattern on a photomask is replicated in a radiation-sensitive layer on the surface of the substrate. In a photolithographic process, a layer of radiation-sensitive material is deposited over the substrate, such as the base substrate or one or more other layers that have been deposited on the base substrate. For instance, when using ultraviolet (UV) light as the radiation source, photoresist, which is a UV-sensitive polymer, is used as the radiation-sensitive layer.

After the photoresist has been deposited onto the substrate, the substrate is placed in an exposure system, and the photomask pattern to be transferred is aligned with any existing patterns on the substrate. The photoresist is then exposed to UV radiation through the photomask. The radiation changes the structure of the photoresist in a manner that depends upon whether the photoresist type is positive or negative. Negative photoresist becomes polymerized, i.e., cross-linked, in areas exposed to the radiation, whereas, in a positive photoresist, the polymer bonds are broken upon exposure. In either case, the photoresist is not affected in regions where the photomask is opaque. After exposure, the photoresist is developed to dissolve the unpolymerized regions, while the polymerized portions of the photoresist remain intact to form a photoresist pattern on the substrate which is essentially identical to the pattern on the photomask.

After the photoresist pattern is formed on the surface of the substrate, portions of the substrate underlying the openings in the photoresist layer may be etched to form holes in the substrate, or dopants may be diffused or implanted into the exposed portions of the substrate. In regard to the first possibility, e.g., etching, it may be desirable to remove a portion of the substrate along a given profile. For example, it may be desirable to remove a portion of the substrate in a direction directly perpendicular to the surface of the substrate. In such a situation, an anisotropic etch may be performed. Alternatively, it may be desirable to remove a portion of the substrate that underlies the photoresist along the edges of the photoresist along with the exposed region. In this circumstance, an isotropic etch may be used, as it tends to undercut the photoresist.

However, it may also be desirable to create a stepped profile, e.g., a tapered or wine glass-shaped profile, in the underlying substrate. In this instance, the deeper portions of the hole in the substrate are narrower than the upper portions of the hole in the substrate: To create this type of stepped hole, a first photoresist pattern having a small hole is created over the substrate, and a first etching step is performed. Thereafter, a second photoresist pattern is created either by redeveloping the first photoresist layer using a different photomask or by removing the first photoresist layer and forming a second photoresist layer having larger openings. Once the revised photoresist pattern has been created, a second etching step is performed. Alternatively, the wider opening my be etched first such that it stops on an etch stop layer, and then the smaller opening may be etched.

This method is undesirable because it requires additional development steps, possibly including two complete photolithographic steps. Also, two photomasks are required, thus causing possible alignment problems.

The present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a method of forming a hole in a substrate. The method includes the acts of: (a) forming a lower layer of photoresist over the substrate; (b) forming an tipper layer of photoresist over the lower layer of photoresist; (c) forming a first opening in the upper layer of photoresist; (d) forming a second opening in the lower layer of photoresist; (e) etching a first portion of the substrate through the first opening and the second opening to form a first hole in the substrate having a first width; and (f) etching a second portion of the substrate through at least the second opening to form a second hole in the substrate having a second width, the second width being greater than the first width.

In accordance with another aspect of the present invention, there is provided a method of forming a hole in a substrate. The method includes the acts of: (a) forming a lower layer of photoresist over the substrate; (b) forming an upper layer of photoresist over the lower layer of photoresist; (c) forming a first opening having a first width in the upper layer of photoresist; (d) forming a second opening having a second width in the lower layer of photoresist, the first width being greater than the second width; (e) etching a first portion of the substrate through the first opening and the second opening to form a first hole in the substrate having the second width; (f) widening the second opening to at least the first width; and (g) etching a second portion of the substrate through the first opening and the second opening to form a second hole in the substrate having at least the first width.

In accordance with a further aspect of the present invention, there is provided a method of forming a hole in a substrate. The method includes the acts of; (a) forming a lower layer of photoresist over the substrate; (b) forming an upper layer of photoresist over the lower layer of photoresist; (c) forming an first opening having a first width in the upper layer of photoresist; (d) forming a second opening having a second width in the lower layer of photoresist, the first width being less than the second width; (e) etching a first portion of the substrate through the first opening and the second opening to form a first hole in the substrate having the first width; and (f) etching a second portion of the substrate through the first opening and the second opening to form a second hole in the substrate having the second width.

BRIEF DESCRIPTION OF THE DRAWINGS

The foregoing and other advantages of the invention will become apparent upon reading the following detailed description and upon reference to the drawings in which.

DESCRIPTION OF SPECIFIC EMBODIMENTS

Figure 1:
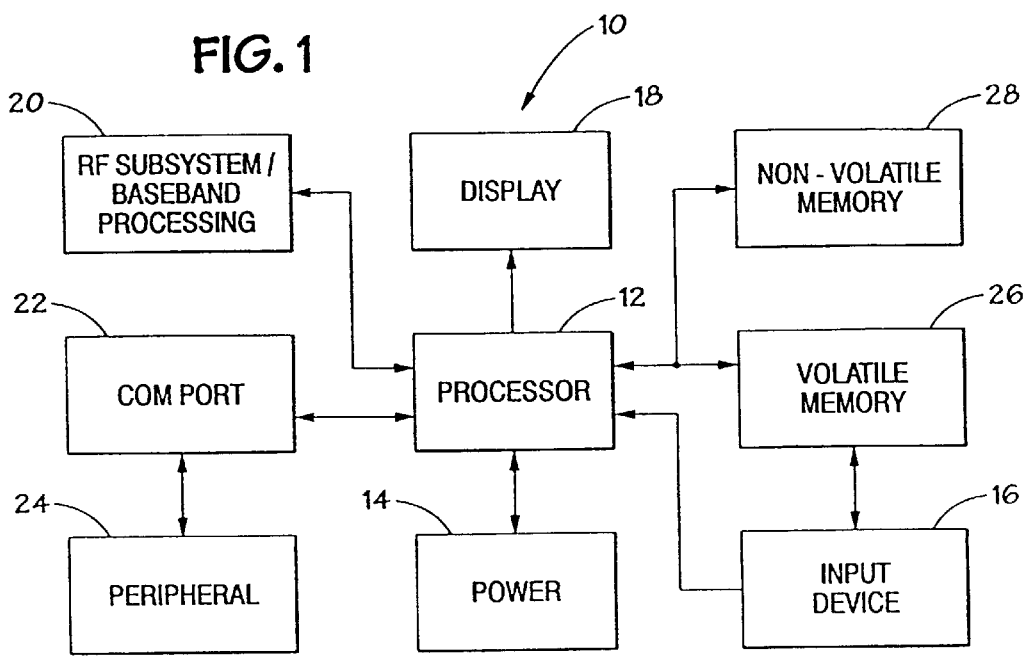
FIG. 1 illustrates a block diagram of an exemplary processor-based device.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance.

Because the processor 12 controls the functioning of the device 10 generally under the control of software programming, memory is coupled to the processor 12 to store and facilitate execution of the program. For instance, the processor 12 may be coupled to volatile memory 26, which may include dynamic random access memory (DRAM) and/or static random access memory (SRAM). The processor 12 may also be coupled to non-volatile memory 28. The non-volatile memory 28 may include a read only memory (ROM), such as an EPROM, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk or tape drive memory.

As is clear from the above discussion, the device 10 may include one or more semiconductor devices, such as a microprocessor or an integrated circuit memory. It is the fabrication of such semiconductor devices that the remainder of this disclosure discusses. More specifically, of particular interest is the formation of substrate openings having tapered or wine glass-shaped profiles, such as a dual damascene structure. However, as discussed previously, known photolithographic techniques for creating such structures exhibit certain problems. Accordingly, FIGS. 2–10, which are described below, illustrate various examples of a stepped photoresist profiles along with various examples of openings and other structures that may be fabricated using stepped photoresist profiles.

Before specifically discussing FIGS. 2–10, it should be understood that in the interest of clarity not all features of an actual implementation of an integrated circuit fabrication process are described. The illustrative embodiments discussed below are restricted to those aspects of an integrated circuit fabrication process related to the formation of a stepped resist profile and the subsequent formation of a stepped opening in the underlying substrate. Conventional details of integrated circuit fabrication processing are not presented as such details are well known in the art of integrated circuit fabrication.

Figure 2:
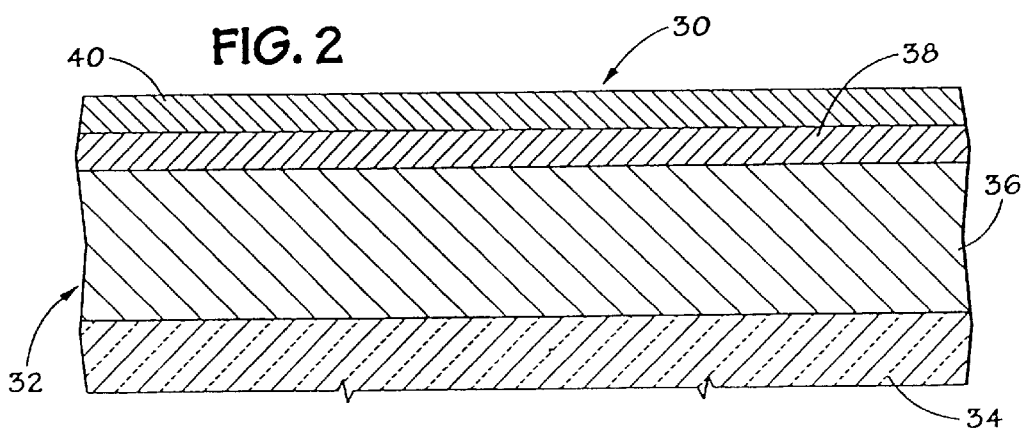
FIG. 2 illustrates a cross-sectional view of an exemplary substrate having two layers of photoresist thereon.

Turning now to FIGS. 2–5, a portion of an integrated circuit device 30 is illustrated during successive stages of fabrication. Specifically, FIGS. 2–5 illustrate the fabrication of a stepped photoresist pattern and a stepped opening in an underlying substrate, such as a dielectric layer. Referring initially to FIG. 2, a substrate is illustrated and generally designated using a reference numeral 32. In this example, the substrate 32 includes a semiconductive region 34, such as a silicon wafer, which has a dielectric layer 36, such as an oxide or nitride, formed thereon. Of course, it should be understood that the material of the substrate 32 may vary depending upon the particular integrated circuit being fabricated. For instance, the substrate 32 may be generally homogeneous in that it may be primarily composed of a semiconductive material or an insulative material. Alternatively, the substrate 32 may be non-homogeneous in that it may represent the upper portion of a partially fabricated integrated circuit which may contain a variety of different materials. Furthermore, the substrate 10 may represent a generally homogeneous portion of a generally non-homogeneous substrate, such as a dielectric portion of a partially fabricated integrated circuit.

To form a stepped photoresist profile, two layers 38 and 40 of a photoresistive material are deposited over the substrate 32. Although the layers 38 and 40 of photoresistive material may be deposited in a conventional manner, certain considerations should be noted. For example, a layer of photoresist is typically spun onto the surface of a substrate. However, once the first layer 38 of photoresistive material has been deposited on the substrate 32, it is possible that the deposition of the second layer 40 of photoresistive material may compromise the integrity of the desired dual layer structure. For example, if the solvent system of the second layer 40 of photoresistive material is similar to the solvent system of the first layer 38 of photoresistive material, the deposition of the second layer 40 of photoresistive material may dissolve at least a portion of the first layer 38 of photoresistive material.

One method of avoiding this problem is to select photoresistive materials having different solvent systems so that depositing the second layer 40 of photoresistive material does not dissolve the first layer 38 of photoresistive material. Alteratively, a layer of a suitable barrier material (not shown), such as polyvinyl alcohol may be deposited over the first layer 38 of photoresistive material prior to the deposition of the second layer 40 of photoresistive material. Regardless of whether the solvent systems of the layers 38 and 40 of photoresistive material are similar or different, the barrier layer should facilitate the deposition of the second layer 40 of photoresistive material without dissolving the first layer of photoresistive material.

Figure 3:
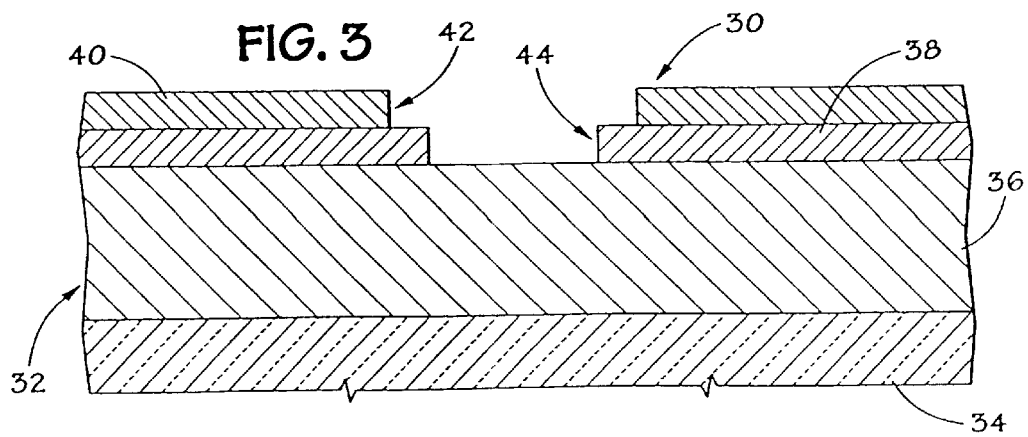
FIG. 3 illustrates a cross-sectional view of FIG. 2 wherein a stepped profile has been formed in the two layers of photoresist.

After the two layers 38 and 40 of photoresistive material have been deposited on the substrate 32, the layers 38 and 40 are exposed and developed to create a stepped profile, such as the profile illustrated by way of example in FIG. 3. Because the developing process utilizes solvents to dissolve the portions of exposed photoresistive material to create the openings 42 and 44 in the respective layers 38 and 40, the use of photoresistive material having different solvent systems and/or having sufficiently different sensitivities may facilitate the formation of the stepped photoresist profile.

To create the stepped profile, the upper layer 40 of photoresistive material is exposed and developed to create a relatively large opening 42, and the lower layer 38 of photoresistive material is exposed and developed to create a relatively smaller opening 44. For example, a single photomask with a controlled exposure may be used to expose the layers 38 and 40, and the openings 42 and 44 may be formed during a single development step. Alternatively, a first photomask may be used to expose one of the layers 38 and 40, and a second photomask may be used to expose the other layer. Then, the openings 42 and 44 may be formed during a single development step. As yet another alternative, the upper layer 40 may be exposed and developed to create the opening 42, and, afterward, the lower layer 38 may be exposed and developed to create the opening 44.

Figure 4:
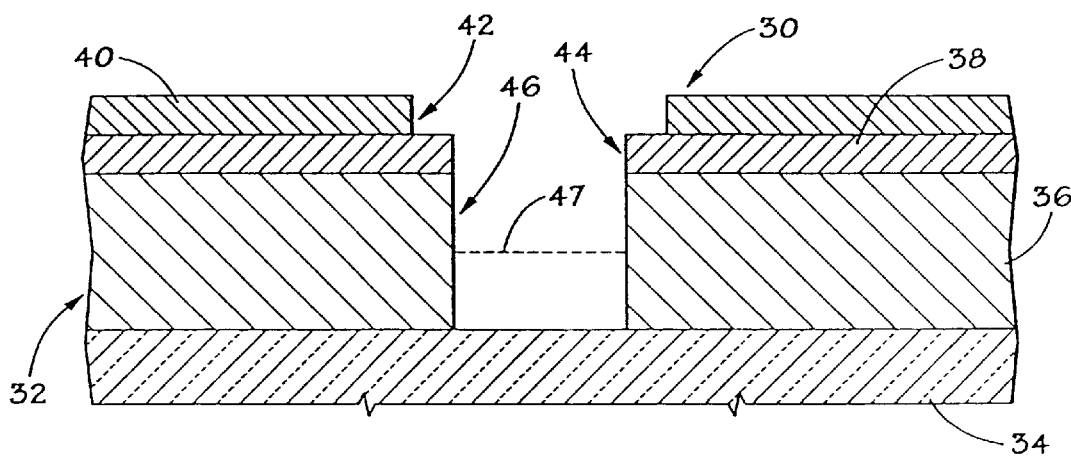
FIG. 4 illustrates a cross-sectional view of FIG. 3 with a hole formed in portion of the substrate.

Once the stepped photoresist profile formed by the openings 42 and 44 has been created, a portion of the substrate 32 underlying the openings 42 and 44 may be removed by etching, for instance, as illustrated in FIG. 4. As a first example, the holes 46 and 48 may be created during a single etching procedure. In this situation, the etchant erodes the photoresistive material at the edges of the openings 42 and 44, and, eventually, substantially removes the portion of the lower layer 38 of photoresistive material which underlies the larger opening 42. Before the lower layer 38 of photoresistive material is removed, the etchant removes a portion of the dielectric layer 36 underlying the smaller opening 44 to form the hole 46. As the etchant removes the portion of the lower layer 38 of photoresistive material which underlies the larger opening 42, the etchant begins to remove a wider area of the dielectric layer 36 underlying the larger opening 42 to form the hole 48. Thus, this single etching step will approximately create the illustrated stepped profile.

Figure 5:
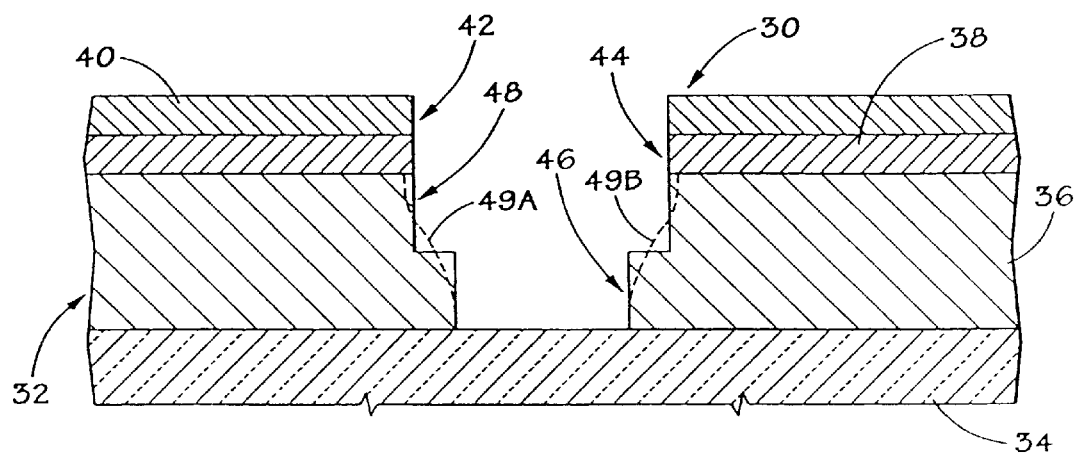
FIG. 5 illustrates a cross-sectional view of FIG. 4 with a second hole formed in a portion of the substrate.

In an alternative example, a first etch may be performed using an etchant that leaves the lower layer 38 of photoresistive substantially in tact while it removes a portion of the dielectric layer 36 exposed by the small opening 44 in the layer 38 of photoresistive material to create a hole 46. The hole 46 may extend down to the substrate 34, as illustrated, or it may stop above the substrate 34 as shown by the dashed line 47. The hole 46 may be created by a wet or dry etch which is isotropic or anisotropic, depending upon the desired characteristics of the hole 46. Once the hole 46 has been formed, a second etch is performed to remove a portion of the lower layer 38 of photoresistive material which underlies the larger opening 42 in the upper layer 48 of photoresistive material. As illustrated in FIG. 5, this etching step widens the opening 44 to be commensurate in size with the opening 42. Because a greater area of the underlying substrate 32 is now exposed, etching removes a wider portion of the dielectric layer 36 to create a hole 48. As illustrated in FIG. 5, the hole 48 extends along a portion of the length of the hole 46 and is greater in dimension than the hole 46 to create the desired stepped profile in dielectric layer 36.

Of course, it should be understood that the illustrated stepped profile is somewhat idealized for the purposes of this discussion. Those skilled in the art will recognize that the actual profile will likely more closely resemble the wine glass-shaped profile illustrated by the dashed lines 49A and 49B depending upon the rate of resist removal during the etching-procedure.

After the stepped profile has been created in the dielectric layer 36, the remaining portions of the layers 38 and 40 of photosensitive material may be removed. Then, the stepped hole may be filled with an appropriate material, such as a conductive material to create a contact or a buried contact, or such as one or more thin layers to create another structure.

Figure 6:
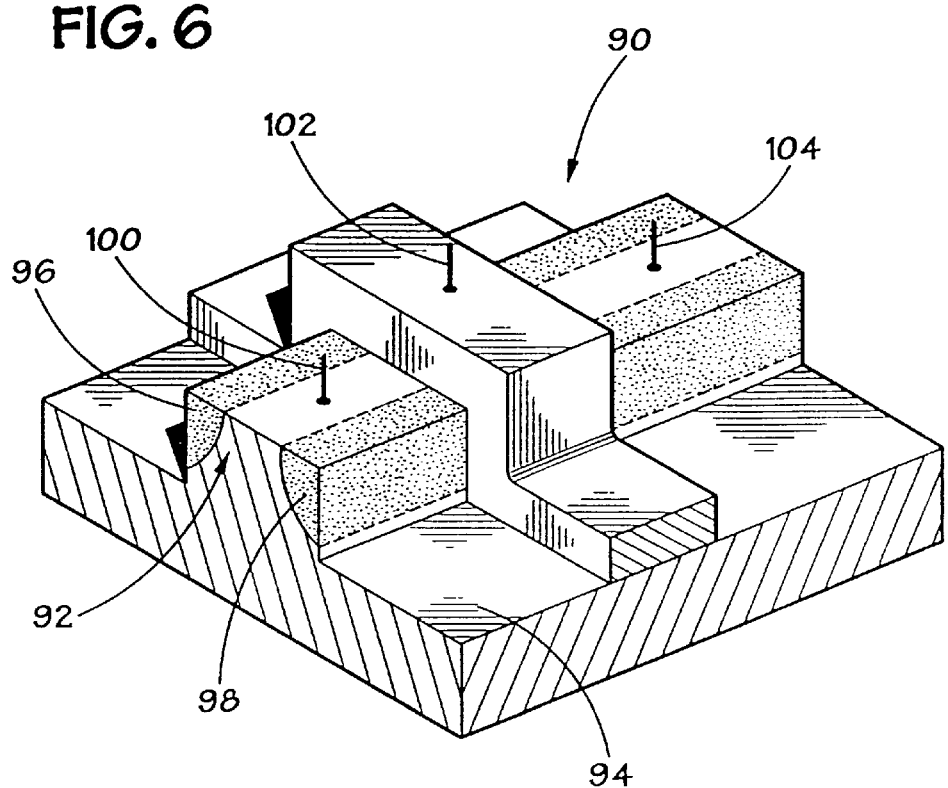
FIG. 6 illustrates a perspective view of a thin-film transistor having an elevated channel which confines the carriers to pockets along the sidewalls of the transistor.

Finally, it should be noted that a stepped photoresist profile may be used to create circuit elements, such as the transistor 90 illustrated in FIG. 6. The transistor 90 has an elevated channel 92 which lies above the main portion of the substrate 94. The elevated channel 92 includes doped regions 96 and 98 that are confined to pockets along the sidewalls of the elevated channel. The transistor 90 is completed by fabricating a source contact 100, a gate contact 102, and a drain contact 104. Due to the elevated channel 92 and the confinement of the doped regions 96 and 98, the transistor 90 may exhibit better on/off ratios than a conventional transistor.

Figure 7:
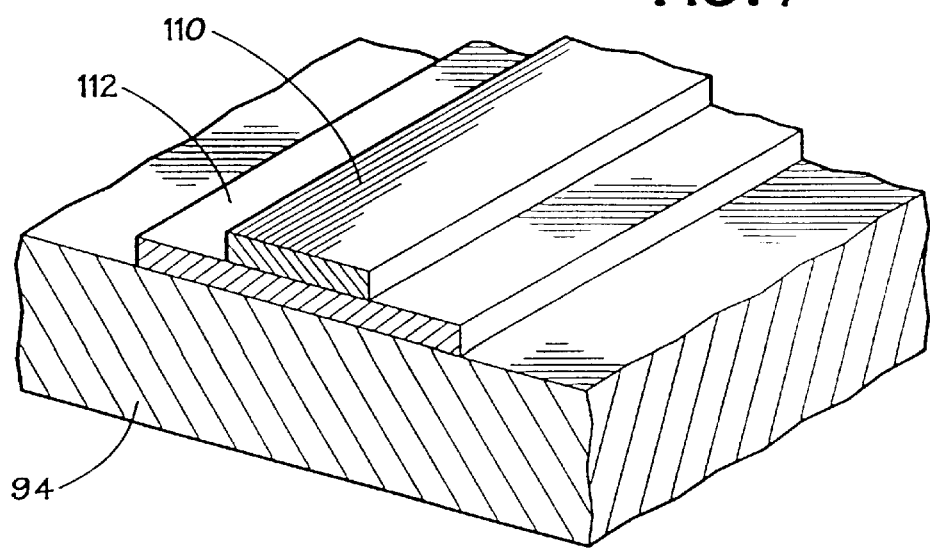
FIG. 7 illustrates a perspective view of a stepped resist pattern used to form the transistor of FIG. 6.

To create the transistor 90 illustrated in FIG. 6, a stepped resist pattern is formed of two resist layers 110 and 112, as illustrated in FIG. 7, in much the same manner as described in the previously discussed examples. The structure is then etched essentially to transfer the stepped pattern into the substrate 94 to form the elevated channel 92 illustrated in FIG. 6.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A structure comprising:
    a first layer of photoresist having a first opening therein having a first width;
    a second layer of photoresist different from the first layer of photoresist and disposed below the first layer of photoresist, the second layer of photoresist having a second opening coincident with the first opening and having a second width substantially equal to the first width of the first opening;
    a substrate whereon each of the first and second layers of photoresist are disposed, the substrate having a third opening coincident with the first and second openings, a top portion of the third opening having a third width which is substantially equal to the first and second widths of the first and second openings and a bottom portion of the third opening having a fourth width, the fourth width being less than the third width; and
    a barrier layer between the first layer of photoresist and the second layer of photoresist, the barrier layer having a fourth opening coincident with the first opening and the second opening and having a fifth width substantially equal to the first width of the first opening.

2. The structure, as set forth in claim 1, wherein the barrier layer comprises polyvinyl-alcohol.

3. The structure, as set forth in claim 1, wherein the first layer of photoresist comprises a different material than the second layer of photoresist.

4. The structure, as set forth in claim 1, wherein the third opening comprises a stepped-structure in the substrate.

5. The structure, as set forth in claim 1, wherein the third opening comprises a wine-glass shaped structure in the substrate.

6. A structure comprising:
    a first layer of material having a first opening therein having a first width;
    a second layer of material disposed below the first layer of material, the second layer of material having a second opening coincident with the first opening and having a second width substantially equal to the first width of the first opening;
    a substrate whereon each of the first and second layers of material are disposed, the substrate having a third opening coincident with the first and second openings, a top portion of the third opening having a third width which is substantially equal to the first and second widths of the first and second openings and a bottom portion of the third opening having a fourth width, the fourth width being less than the third width; and
    a barrier layer between the first layer of material and the second layer of material, the barrier layer having a fourth opening coincident with the first opening and the second opening and having a fifth width substantially equal to the first width of the first opening.

7. The structure, as set forth in claim 6, wherein the barrier layer comprises polyvinyl-alcohol.

8. The structure, as set forth in claim 6, wherein the first layer of material comprises a different material than the second layer of material.

9. The structure, as set forth in claim 6, wherein the third opening comprises a stepped-structure in the substrate.

10. The structure, as set forth in claim 6, wherein the third opening comprises a wine-glass-shaped structure in the substrate.

\* \* \* \* \*